US009009553B2

(12) United States Patent
Rajski et al.

(10) Patent No.: US 9,009,553 B2
(45) Date of Patent: Apr. 14, 2015

(54) SCAN CHAIN CONFIGURATION FOR TEST-PER-CLOCK BASED ON CIRCUIT TOPOLOGY

(71) Applicant: Mentor Graphics Corporation, Wilsonville, OR (US)

(72) Inventors: Janusz Rajski, West Linn, OR (US); Jedrzej Solecki, Poznan (PL); Jerzy Tyszer, Poznan (PL); Grzegorz Mrugalski, Swardzez (PL)

(73) Assignee: Mentor Graphics Corporation, Wilsonville, OR (US)

( * ) Notice: Subject to any disclaimer, the term of this patent is extended or adjusted under 35 U.S.C. 154(b) by 115 days.

(21) Appl. No.: 13/919,991

(22) Filed: Jun. 17, 2013

(65) Prior Publication Data
US 2014/0372819 A1    Dec. 18, 2014

(51) Int. Cl.
G01R 31/28    (2006.01)
G01R 31/3177    (2006.01)

(52) U.S. Cl.
CPC .................................. *G01R 31/3177* (2013.01)

(58) Field of Classification Search
USPC .................................................. 714/729, 726
See application file for complete search history.

(56) References Cited

U.S. PATENT DOCUMENTS

| | | | | |
|---|---|---|---|---|
| 7,840,865 | B2 * | 11/2010 | Lai et al. | 714/728 |
| 2003/0070127 | A1 * | 4/2003 | Kusko et al. | 714/726 |
| 2007/0273401 | A1 * | 11/2007 | Kiryu | 326/16 |
| 2008/0235544 | A1 * | 9/2008 | Lai et al. | 714/729 |
| 2010/0257417 | A1 * | 10/2010 | Rajski et al. | 714/731 |
| 2011/0231722 | A1 * | 9/2011 | Mukherjee et al. | 714/729 |

OTHER PUBLICATIONS

B. Konemann, J. Mucha and G. Zwiehoff, Institut : "Built-In Logic Block Observation Techniques" 1979 IEEE Test Conference, Cherry Hill, New Jersey (1979).
A. Krasniewski and S. Pilarski: "Circular Self-Test Path: A Low-Cost BIST Technique for VLSI Circuits", IEEE Transactions on Computer Aided Design, vol. 8, No. 1 (Jan. 1989).

* cited by examiner

Primary Examiner — M. Mujtaba K Chaudry

(57) ABSTRACT

Aspects of the invention relate to generating scan chain configurations for test-per-clock based on circuit topology. With various implementations of the invention, weight vectors between scan chains in a circuit are first determined. Based on the weight vectors, a scan chain configuration is generated by assigning some scan chains in the scan chains to a stimuli group and some other scan chains in the scan chains to a compacting group. Here, the stimuli group comprises scan chains to operate in a shifting-launching mode, and the compacting group comprises scan chains to operate in a capturing-compacting-shifting mode.

14 Claims, 7 Drawing Sheets

Flow chart
400

Flow chart
200

Flow chart 400

Flow chart 405

SCAN CHAIN CONFIGURATION FOR TEST-PER-CLOCK BASED ON CIRCUIT TOPOLOGY

FIELD OF THE INVENTION

The present invention relates to the field of circuit testing technology. Various implementations of the invention may be particularly useful for scan-based testing.

BACKGROUND OF THE INVENTION

Since its introduction in the late 1960's, scan-based testing has gained a wide acceptance as a structured design-for-test (DFT) methodology. This methodology connects memory elements such as flip-flops and latches in a circuit to form scan chains and uses them to make internal nodes of the circuit highly controllable and observable. The controllability and observability enables high-quality automated test generation for large industrial circuit designs.

A commonly used scheme of the scan-based testing is test-per-scan. In a test-per-scan system, a test pattern is first shifted into scan chains and subsequently applied to the circuit-under-test. The test responses generated by the circuit-under-test are then captured by and shifted out of the scan chains for analysis. In this testing scheme, the shifting in and out operations require much more clock cycles to perform than the actual testing (i.e. launching and capturing) operation does. Moreover, in part due to power concerns, the shifting clock is usually kept slower than the clock for the circuit's normal operation. This further increases time for the data loading and unloading operations.

Consider, for example, a circuit design with 100,000 scan cells. These scan cells are divided into 500 scan chains, each 200 scan cells long. Assume the shifting and the normal operating clock frequencies of 50 MHz and 500 MHz, respectively. Applying 20,000 double-capture test patterns requires 4,000,000 shift cycles at 50 MHz and 40,000 capture cycles at 500 MHz. As a result, as low as 1% of cycles, or just 0.1% of time, is spent on the actual testing operation—applying test data and capturing test response data. If a BIST (built-in self-test) method is used for the same circuit design, the test time efficiency could be even lower. With 100K single-capture test patterns, 20,000,000 cycles are needed for scan shifting while only 100,000 cycles are needed for launching and capturing. Using the same clock frequencies as the above example, 99.95% of test time is spent on scan shifting. The above two examples demonstrate that the test-per-scan scheme, though well developed and widely adopted, is not very efficient with respect to testing time.

An alternative scheme, test-per-clock, has been developed mainly for BIST. In a conventional test-per-clock BIST system, the outputs of a test pattern generator are directly coupled to the inputs of the circuit-under-test. Accordingly, a new test pattern is applied to the circuit-under-test at every test clock cycle.

A 1979 paper by Konemann et al., "Built-in logic block observation techniques," 1979 IEEE Test Conference, which is incorporated herein by reference, describes such a system referred to as BILBO (built-in logic block observer). A BILBO is composed of a flipflop register with additional gates for shift and feedback operations. Four different operational modes can be performed by the BILBO: a mission mode (normal circuit functional mode with scan cells working as latches), a linear shift register mode, a feedback mode, and a reset mode for register resetting. In the feedback mode, the BILBO can work either as a multiple-input signature register (MISR) for compacting test responses or as a linear feedback shift register (LFSR) for generating pseudorandom test patterns. The latter is accomplished by keeping constant values at the parallel inputs of the scan chain.

The 1979 paper describes an example of a test-per-clock architecture with BILBOs working in pairs. One BILBO in a BILBO pair is configured to operate in the feedback mode functioning as a linear feedback shift register. This LFSR BILBO generates and launches a test pattern every test clock cycle. In the meantime, the other BILBO in the pair is configured to operate also in the feedback mode but functioning as a multiple-input signature generator. This MISR BILBO captures a test response every test clock cycle and compacts it with its previously compacted test response to form a new compacted test response. After a number of test clock cycles, a test response signature is eventually shifted out of the MISR BILBO by switching its operational mode from the feedback mode to the linear shift register mode. The unloaded test response signature can then be analyzed.

Another test-per-clock BIST system is described in a 1989 paper by Krasniewski et al., "Circular self-test path: a low cost BIST technique for VLSI circuits," IEEE Trans. CAD, vol. 8, pp. 46-55, 1989, which is incorporated herein by reference. This system uses a feedback shift register with the last flipflop being supplied to the first flipflop. This shift register serves simultaneously for test pattern generation and test response compaction.

Compared to the test-per-scan scheme, the test-per-clock scheme is more time-efficient because no slow shifting operation is needed for every test pattern. However, the conventional test-per-clock BIST scheme may have a problem on power consumption. In the traditional test-per-clock BIST scheme, all scan chains change their contents every clock cycle no matter whether they are used for pattern generation or for test response compaction. This can lead to excessive circuit toggling and thus power dissipation. Moreover, the traditional test-per-clock scheme has been developed mainly for BIST. It is desirable to develop a new test-per-clock scheme that not only is more time-efficient than the test-per-scan scheme but also addresses the limitations of the existing test-per-clock scheme. Disclosed below are techniques related to a test-per-clock scheme based on dynamically-partitioned reconfigurable scan chains. More specifically for this disclosure, circuit-topology-based techniques for identifying scan chains for various scan chain configurations are discussed.

BRIEF SUMMARY OF THE INVENTION

Aspects of the invention relate to generating scan chain configurations for test-per-clock based on circuit topology. With various implementations of the invention, weight vectors between scan chains in a circuit are first determined. The value and direction of a weight vector between two scan chains represent the number and direction of combinational circuit paths connecting scan cells of the two scan chains, respectively. Based on the weight vectors, a scan chain configuration is generated by assigning some scan chains in the scan chains to a stimuli group and some other scan chains in the scan chains to a compacting group. Here, the stimuli group comprises scan chains to operate in a shifting-launching mode, and the compacting group comprises scan chains to operate in a capturing-compacting-shifting mode.

In some embodiments of the invention, the scan chain configuration generation starts with selecting a weight vector that has a largest value in the weight vectors. A scan chain from which the selected weight vector is directed and a scan chain to which the weight vector is directed are assigned to the stimuli group and the compacting group, respectively. If a predetermined condition related to number of scan chains in the stimuli group, number of scan chains in the compacting group, or both is met, a scan chain configuration is formed and its information is stored.

Otherwise, weight vectors directed to scan chains in the stimuli group and weight vectors directed from scan chains in the compacting group are removed from consideration. A weight vector having a next largest value is selected and two scan chains connected by this weight vector are assigned in a similar way. These operations are repeated until the predetermined condition is met.

To construct another scan chain configuration, weight vectors directed from scan chains in the stimuli group to scan chains in the compacting group are removed from the weight vectors to form updated weight vectors. The above process is then repeated based on the updated weight factors.

DETAILED DESCRIPTION OF THE INVENTION

Various aspects of the present invention relate to generating scan chain configurations for test-per-clock based on circuit topology. In the following description, numerous details are set forth for the purpose of explanation. However, one of ordinary skill in the art will realize that the invention may be practiced without the use of these specific details. In other instances, well-known features have not been described in details to avoid obscuring the present invention.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

The detailed description of a method or a device sometimes uses terms like "generate" and "determine" to describe the disclosed method or the device function/structure. Such terms are high-level abstractions. The actual operations or functions/structures that correspond to these terms will vary depending on the particular implementation and are readily discernible by one of ordinary skill in the art. It should also be appreciated by one of ordinary skill in the art that the term "coupled" means "connected directly or indirectly."

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods.

Figure 1:
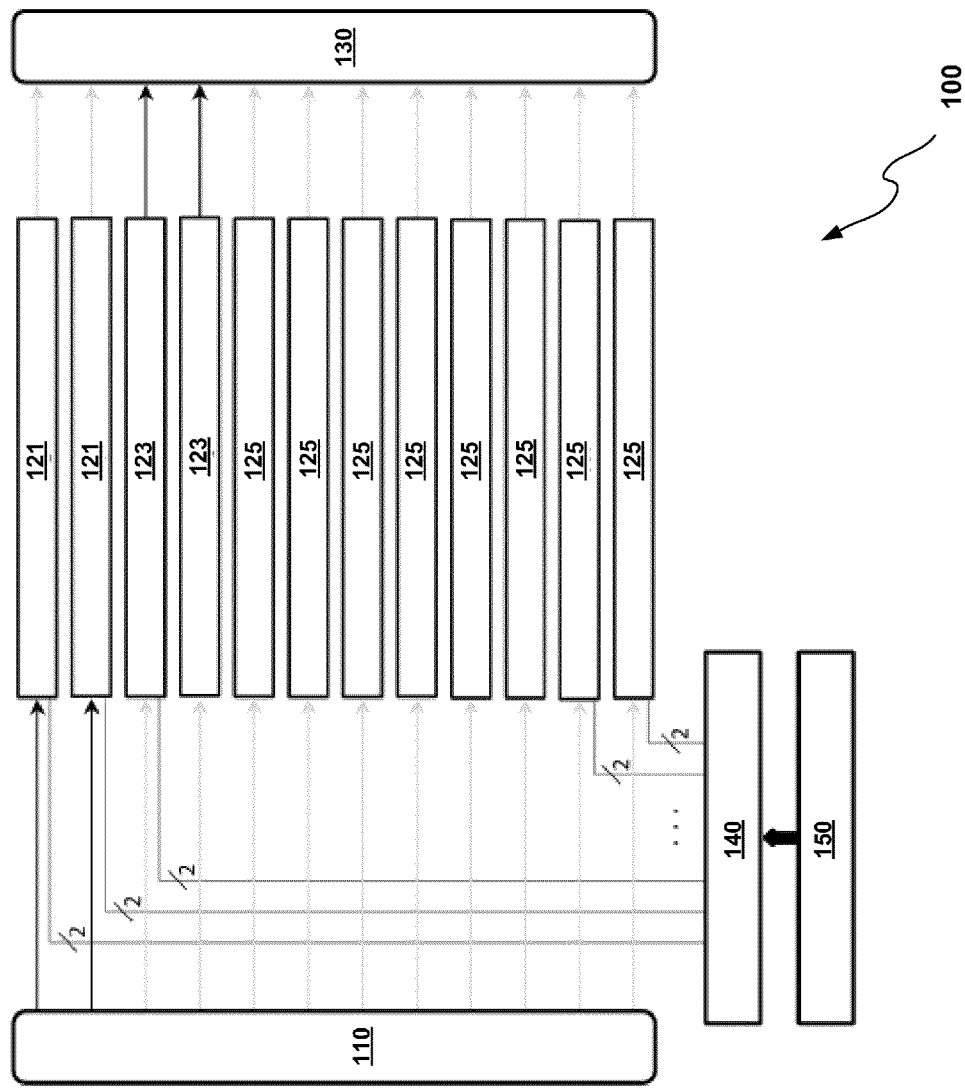
FIG. 1 illustrates an example of a test architecture for test-per-clock based on dynamically partitioned and reconfigurable scan chains that may be employed by various embodiments of the invention.

FIG. 1 illustrates an example of a test architecture for test-per-clock that may be employed by various embodiments of the invention. The test architecture 100 comprises a test stimuli source 110, scan chains 121-125, a test response collector 130, a configuration register 140 and a configuration source 150. The test stimuli source 110 may be an ATE (automated test equipment), a test data decompressor driven by an ATE, a PRPG (pseudorandom pattern generator), or any device that can supply test patterns in some form. The ATE is commonly used for deterministic testing. The deterministic testing usually employs test patterns generated by ATPG (automatic test pattern generation). To test a large circuit, compressed test patterns are often used. Before being shifted into scan chains, the compressed test patterns are decompressed by the test data decompressor. For non-deterministic testing such as BIST, the PRPG can serve as the test stimuli source.

The test response collector 130 in the test architecture 100 may be the same ATE used as the test stimuli source 110, a test response compactor, or any device that can collect and perhaps analyze test responses shifted out of the scan chains. The test response compactor may compact test responses spatially, temporally, or both. The spatial compaction may be achieved by using a spatial compactor constructed with elementary gates such as AND, OR, NAND and NOR gates. The temporal compaction may be accomplished by using, for example, a multiple-input signature register (MISR).

The test stimuli source 110 and the test response collector 130 described above are similar to those used in a conventional test architecture. The scan chains 121-125 in the test architecture 100, however, are configured differently from conventional scan chains. Unlike conventional scan chains, scan chains used in various embodiments of the invention can operate, depending on a control signal, in one of at least three modes: a shifting-launching mode, a capturing-compacting-shifting mode and a mission mode. In the mission mode, scan chains perform regular circuit functions; in the shifting-launching and capturing-compacting-shifting modes, scan chains are used for testing the circuit. Specifically, scan chains in the shifting-launching mode are responsible for controlling the internal states of the circuit-under-test. They shift test data in and applying them to the circuit-under-test every clock cycle. Moreover, they do not capture any test responses. Scan chains in the capturing-compacting-shifting mode, on the other hand, are responsible for collecting test response data generated by the circuit-under-test. They shift out one bit of a previously compacted test response signal while compacting remaining bits of the previously compacted test response signal with a currently-captured test response signal to form a currently compacted test response signal.

In FIG. 1, the scan chains 121, 123 and 125 are shown to work in the shifting-launching mode, the capturing-compacting-shifting mode and the mission mode, respectively. The control signal for mode switching is generated by the configuration source 150 and applied to the scan chains 121, 123 and 125 by the configuration register 140. FIG. 1 only illustrates one configuration (partition) of the scan chains. Different partitions of the scan chains can be obtained by varying the control signal. The content of the configuration register 140 can be reloaded during a test session, depending on various requirements. In particular, the control signal may be varied with test patterns applied. The configuration source 150 may be an on-chip device or an external device.

As seen in the figure, a majority of the scan chains operate in the mission mode. This arrangement can alleviate power issues because logic states associated with these scan chains closely resemble those when the circuit works in its designed functional mode. Only a small portion of the scan chains may cause extrinsic circuit toggling. In a conventional at-speed scan test, by contrast, a capture clock burst is applied to all scan chains which can result in a sudden current change within a few nanoseconds and thereby circuit failures.

Figure 2:
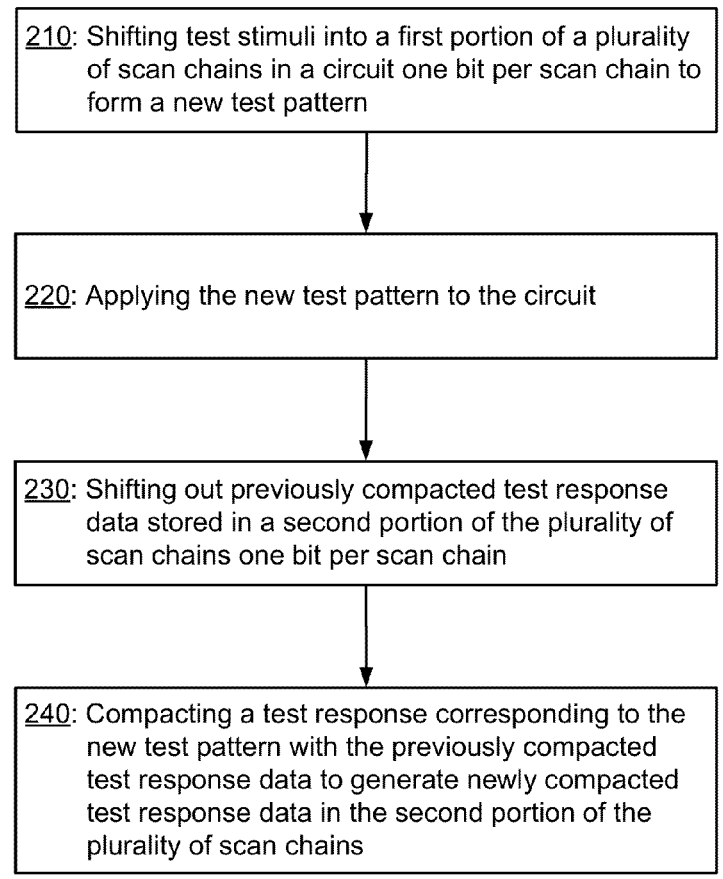
FIG. 2 illustrates a flow chart describing methods of test-per-clock based on dynamically-partitioned configurable scan chains that may be employed by various embodiments of the invention.
Figure 3:
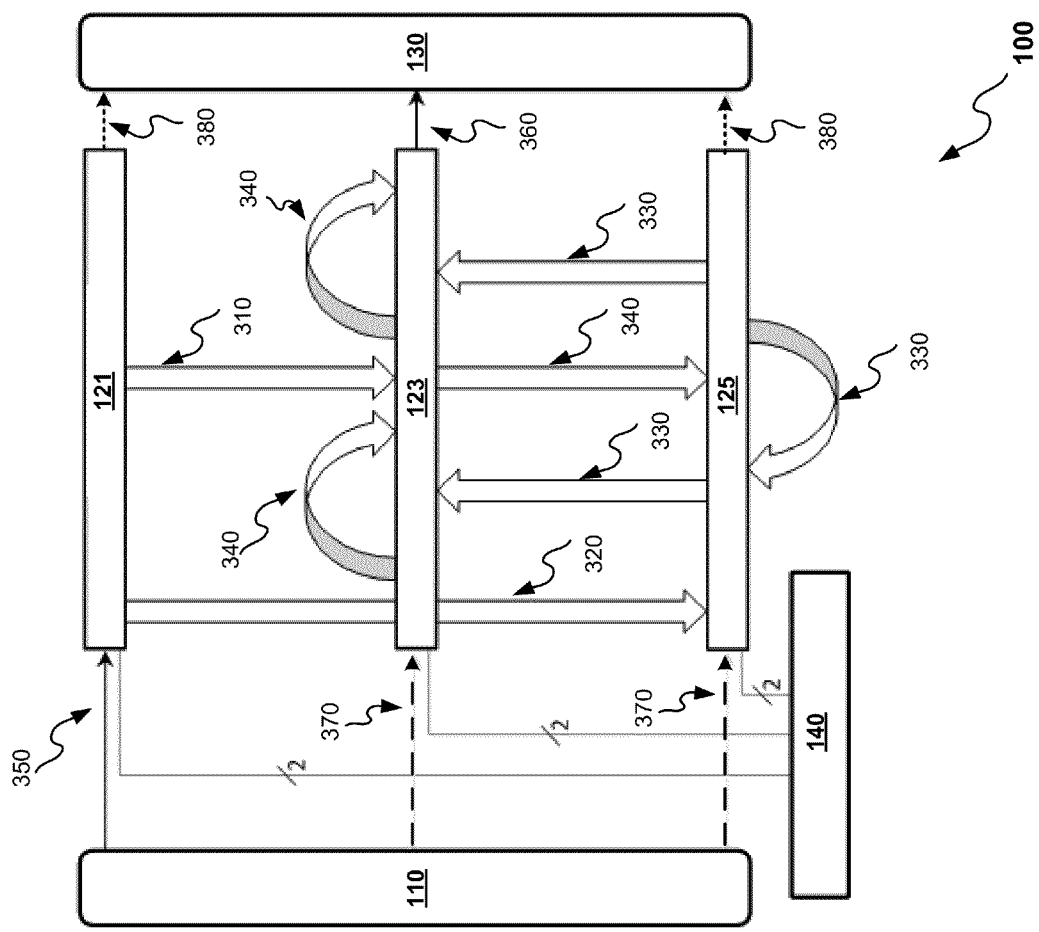
FIG. 3 illustrates an example of how the scan chains 121-125 in FIG. 1 interact with each other during testing.

FIG. 2 illustrates a flow chart 200 describing methods of test-per-clock based on dynamically-partitioned configurable scan chains that may be employed by various embodiments of the invention. FIG. 3 illustrates an example of how the scan chains 121-125 in FIG. 1 interact with each other during testing. To simplify the figure, only one scan chain is used to represent scan chains in each operation mode. For ease of understanding, methods of test-per-clock based on dynamically partitioned and reconfigurable scan chains that may be employed according to various embodiments of the invention will be described with reference to the flow chart 200 in FIG. 2 and the test architecture 100 illustrated in FIG. 3. It should be appreciated, however, that alternate implementations of a test architecture may be used to perform the methods of test-per-clock based on dynamically-partitioned configurable scan chains illustrated by the flow chart 200 according to various embodiments of the invention. Likewise, the test architecture 100 may be employed to perform other methods of test-per-clock based dynamically-partitioned configurable scan chains according to various embodiments of the invention.

In operation 210, test stimuli are shifted from a stimuli source (test stimuli source 110) into a first portion of a plurality of scan chains in a circuit (scan chains 121) one bit per scan chain to form a new test pattern as illustrated by an arrow 350. The connections between the test stimuli source 110 and the scan chains 123 and 125 are blocked as illustrated by arrows 370 with broken lines.

Immediately after being formed, in operation 220, the new test pattern is applied to the circuit. The new test pattern propagates through the combinational part of the circuit until a test response reaches a second portion of the plurality of scan chains (scan chains 123) as illustrated by an arrow 310. A circuit response caused by the new test pattern also reaches a third portion of the plurality of scan chains (scan chains 125) as illustrated by an arrow 320. This circuit response will circulate within the circuit and eventually reach the scan chains 123 as illustrated by arrows 330.

In operation 230, the scan chains 123 shift out previously compacted test response data one bit per scan chain to the test response collector 130 as illustrated by an arrow 360. The connections between the test response collector 130 and the scan chains 121 and 125 are blocked as illustrated by arrows 380 with broken lines.

At about the same time as the operation 230, in operation 240, the test response corresponding to the new test pattern is compacted with the previously compacted test response data to generate newly compacted test response data in the scan chains 123. As shown in FIG. 3, the scan chains 123 are also employed to drive the circuit as illustrated by arrows 340, which is referred to as a mode of capturing-compacting-shifting without blocking. This functionality can be disabled if needed and the scan chains operate in a mode referred to as a mode of capturing-compacting-shifting with blocking As noted previously, the scan chains 121, 123 and 125 are configured to operate in the shifting-launching mode, the capturing-compacting-shifting mode and the mission mode, respectively, based on the control signal stored in the configuration register 140. The above four operations may be performed once for every clock cycle for a predetermined number of times. At the end, a different control signal may be loaded into the configuration register 140 to reconfigure the scan chains. The reconfigured scan chains are then employed for the next test pattern(s). This dynamic partitioning and reconfiguring approach contrasts not only the conventional scan method but also the BILBO approach discussed in the background section.

Another difference between various embodiments of the present invention and the BILBO-based techniques may lie in the operation of test response compaction. As previously noted, a BILBO scan chain in the feedback mode works as a multiple-input signature generator for compacting test responses: Test responses are captured and compacted for a number of clock cycles (corresponding to the same number of test patterns) to generate a signature. No bit of the compacted test response signal is shifted out during that time period. Instead, the signature is shifted out after a number of test patterns are applied. By contrast, a scan chain in the capturing-compacting-shifting mode according to various embodiments of the invention does not have a feedback loop. Moreover, one bit of previously compacted test response data is shifted out every clock cycle.

By adopting the test-per-clock scheme, various embodiments of the invention remove the lengthy scan shift-in phase used in the test-per-scan scheme and perform launch-capture testing every clock cycle. This allows more test patterns to be applied within a certain period of time and may improve the fault coverage. Alternatively, one can choose to apply the same number of test patterns as that of a conventional scan test, yet in a much shorter period of time, thereby reducing the test cost.

By dynamically partitioning and reconfiguring the scan chains, the disclosed test-per-clock scheme can allow the majority of scan chains to operate in the mission mode to alleviate power issues without significant impact on test generation and fault coverage. The control signal remains static after a given configuration is established. It can, therefore, be placed and routed with no rigid timing constrains similar to those of scan enable signals whose distribution and delivery, especially for the at-speed test purpose, must meet non-flexible timing closure conditions. The low-power capabilities may enable applying test patterns at higher, close to the functional, frequency, which can further increase fault coverage metrics.

To realize low power and high test quality potentials of the disclosed test-per-clock scheme, scan chain configurations need to be carefully designed. Disclosed below are techniques for designing scan chain configurations based on circuit topology.

Figure 4A:
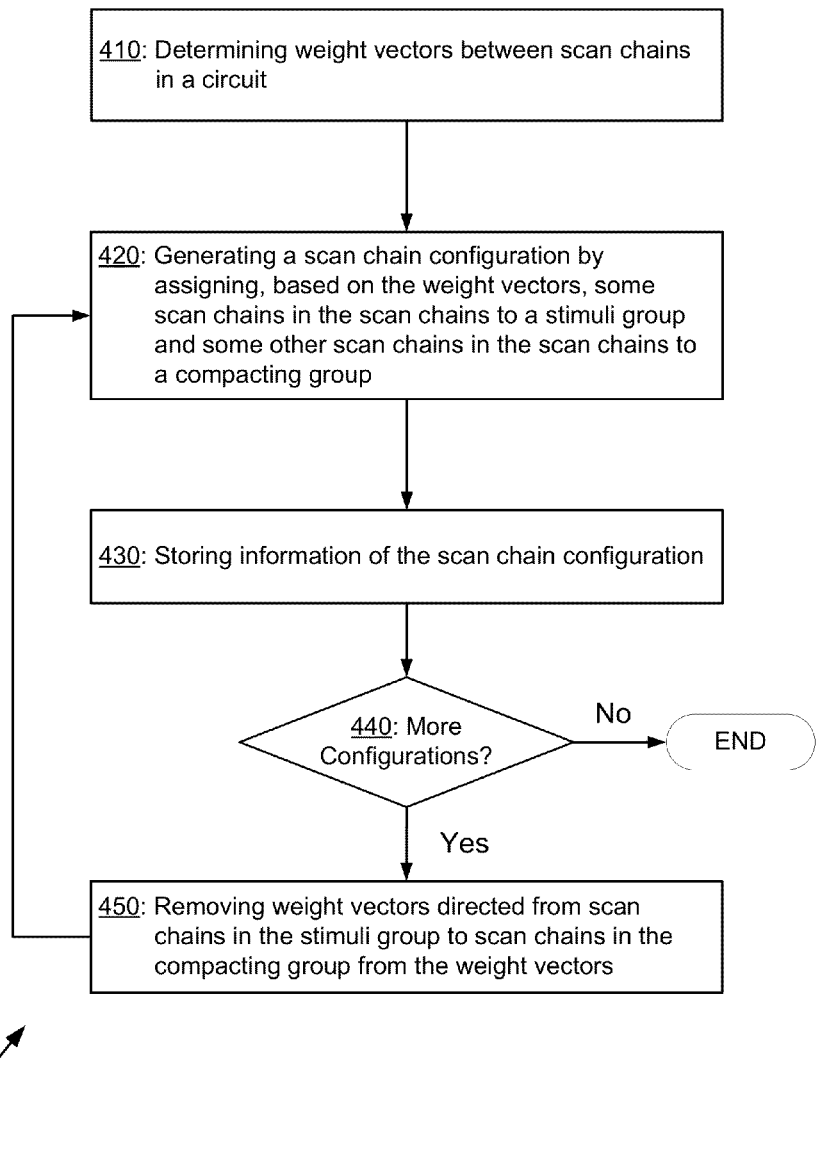
FIG. 4A illustrates a flow chart describing methods of designing scan chain configurations based on circuit topology that may be employed by various embodiments of the invention.

FIG. 4A illustrates a flow chart 400 describing methods of designing scan chain configurations based on circuit topology that may be employed by various embodiments of the invention. The process attempts to find two groups of scan chains that maximize the total weight of weight vectors directed from one to the other under at least one condition with respect to number of scan chains in the two groups. During a test session, scan chains in these two groups will be configured to operate in the shifting-launching mode (the stimuli group) and the capturing-compacting-shifting mode (the compacting group), respectively.

Figure 5:
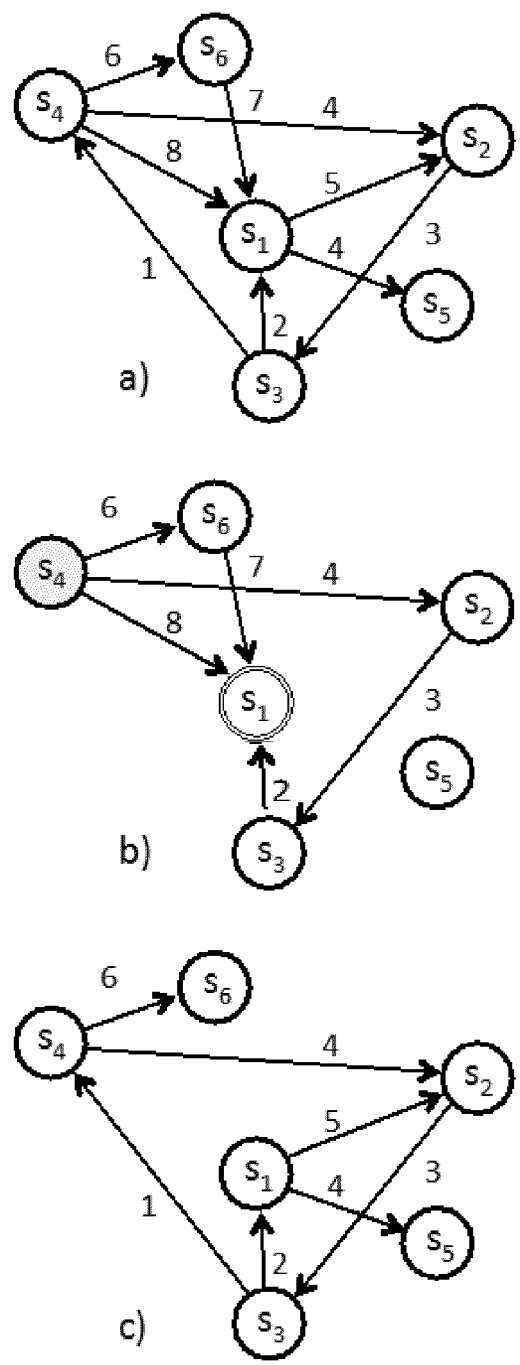
FIG. 5 illustrates an example of a weight vector graph in different stages of a process for generating scan chain configurations.

Initially, in operation 410, weight vectors between scan chains in a circuit are determined. The value and direction of a weight vector between two scan chains represent the number and direction of combinational circuit paths connecting scan cells of the two scan chains, respectively. A graph can be constructed to illustrate the relationship of scan chains. In such a graph, vertices represent scan chains while edges connecting vertices represent weight vectors. Part (a) of FIG. 5 illustrates an example of a scan chain graph. The graph has six vertices (scan chains) $S_1$-$S_6$ along with nine edges. The arrow and number for each edge indicate the direction and value of the corresponding weight vector, respectively. For example, a weight vector is shown to run from scan chain $S_4$ to scan chain $S_6$, with a value of 6. This indicates that there are six combinational circuit paths from scan cells in $S_4$ to scan cells in $S_6$.

Next, in operation 420, a scan chain configuration is generated by assigning, based on the weight vectors, some scan chains in the scan chains to a stimuli group and some other scan chains in the scan chains to a compacting group. As noted before, the objective is to maximize the total weight of weight vectors directed from the stimuli group to the compacting group under at least one condition with respect to number of scan chains in the stimuli group, the compacting group, or both. A detailed process for generating a scan chain configuration according to some embodiments of the invention will be discussed later.

In operation 430, information of the generated scan chain configuration is stored. In operation 440, a decision is made on whether more scan chain configurations are needed. One of the criteria may be whether there are more weight vectors other than those directed from the stimuli group to the compacting group. If another scan chain configuration needs to be generated, in operation 450, weight vectors directed from scan chains in the stimuli group to scan chains in the compacting group are removed from the weight vectors. With the updated weight vectors, the operation 420 is performed again to derive new stimuli and compacting groups. As will be appreciated by a person of ordinary skill in the art, a scan chain assigned to the previous stimuli group may be assigned to the new compacting group, and vice versa. Accordingly, scan chains may be dynamically reconfigured during a test.

Figure 4B:
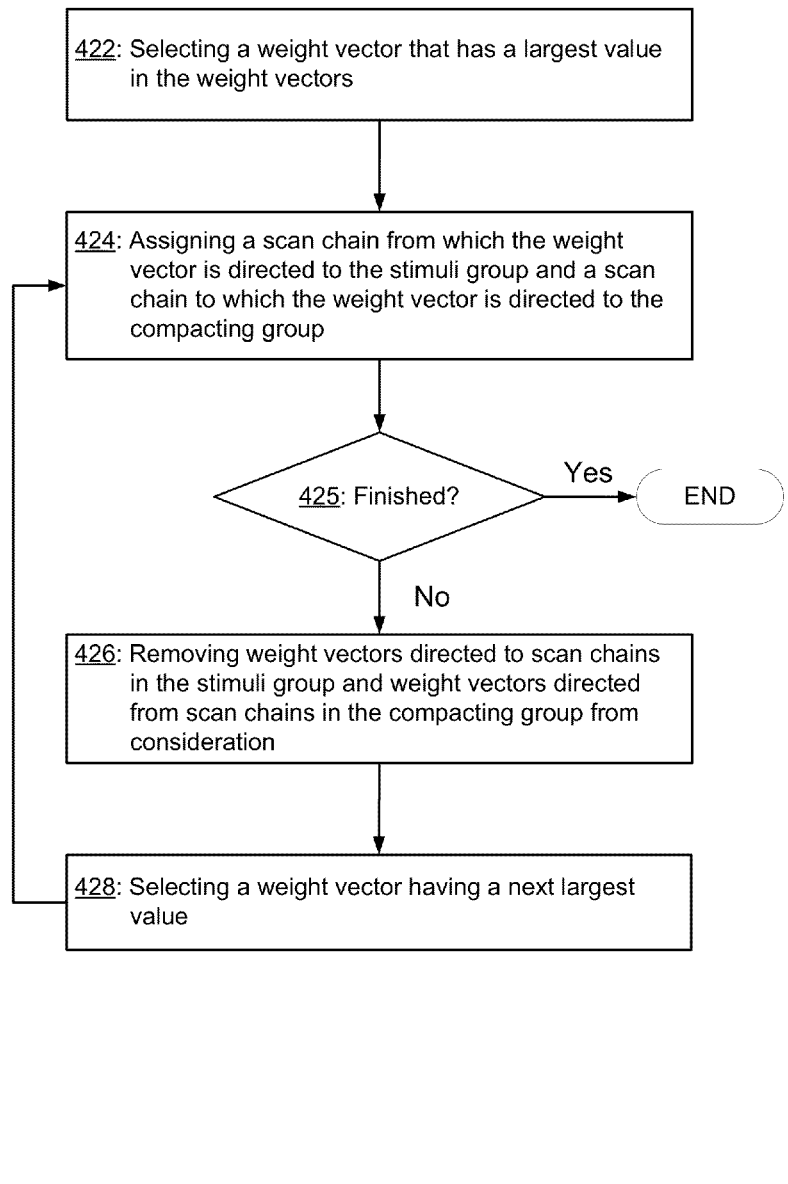
FIG. 4B illustrates a flow chart describing detailed methods of scan chain configuration generation according to some embodiments of the invention.

FIG. 4B illustrates a flow chart 405 describing detailed methods of scan chain configuration generation according to some embodiments of the invention. For ease of understanding, the flow chart 405 will be discussed by using the example shown in FIG. 5.

Initially, in operation 422, a weight factor that has the largest value in the weight vectors is selected. In (a) of FIG. 5, the weight vector connecting scan chains $S_4$ and $S_6$ (referred to as $S_4S_6$) is selected as it has the largest value of 8.

Next, in operation 424, the scan chain from which the selected weight vector is directed (the first scan chain) and the scan chain to which the selected weight vector is directed (the second scan chain) are assigned to the stimuli group and the compacting group, respectively. In the example of (a) of FIG. 5, scan chain $S_4$ is assigned to the stimuli group and scan chain $S_6$ to the compacting group.

Next, in operation 425, a predetermined condition for termination is checked. As noted earlier, a condition with respect to the number of scan chains in the stimuli group, the compacting group, or both may be checked. For example, the total number of scan chains in the two groups may be set as 3. In this case, the process continues to operation 426.

In operation 426, weight vectors directed to scan chains in the stimuli group and weight vectors directed from scan chains in the compacting group are removed from consideration. This is because scan chains in the shifting-launching mode do not capture test responses and sequential connections involving scan chains in the capturing-compacting-shifting mode are not considered even if scan chains with no gating logic propagate signals back to the circuit. Part (b) of FIG. 5 illustrates the result of the operation 426: weight factors $S_3S_4$, $S_1S_2$ and $S_1S_5$ are removed.

In operation 428, a weight vector having the next largest value is selected from the remaining weight factors. That weight factor is $S_6S_1$ with a value of 7 in FIG. 5. Now the process returns to the operation 424, which assigns $S_6$ to the stimuli group ($S_1$ has been assigned to the compacting group previously). In this example, the process shown in FIG. 4B ends here after the predetermined condition is checked in operation 425 because there are totally three scan chains in the stimuli group and the compacting group.

The main process shown in FIG. 4A, however, may continue to generate the next scan chain configuration if the criterion for termination is, for example, whether there are more weight vectors not directed from the stimuli group to the compacting group. The operation 450 removes weight vectors directed from scan chains in the stimuli group to scan chains in the compacting group from the weight vectors to form updated weight vectors as discussed above. Part (c) of FIG. 5 shows the result: $S_4S_1$ and $S_6S_1$ are not in the updated weight vectors. The second scan chain configuration can be generated based on the updated weight vectors.

Figure 6:
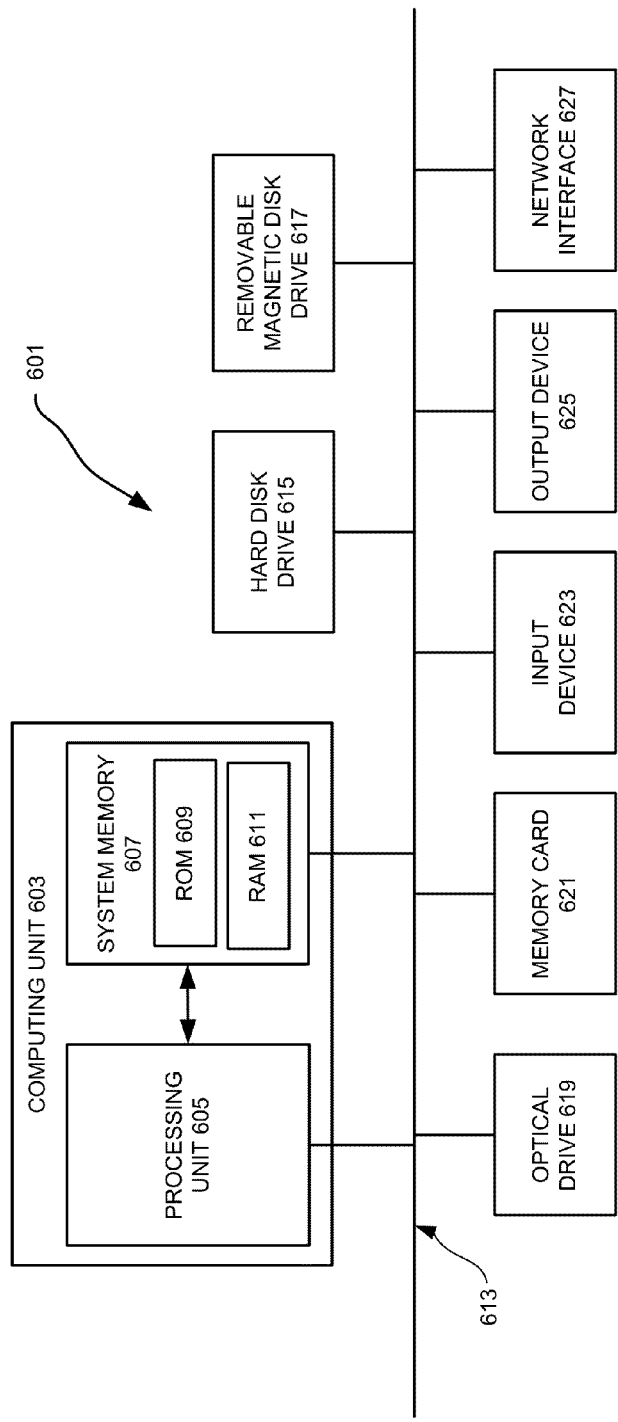
FIG. 6 illustrates a programmable computer system with which various embodiments of the invention may be employed.

Various embodiments of the invention may be implemented through the execution of software instructions by a computing device, such as a programmable computer. FIG. 6 shows an illustrative example of such a programmable computer (a computing device 601). As seen in this figure, the computing device 601 includes a computing unit 603 with a processing unit 605 and a system memory 607. The processing unit 605 may be any type of programmable electronic device for executing software instructions, but will conventionally be a microprocessor. The system memory 607 may include both a read-only memory (ROM) 609 and a random access memory (RAM) 611. As will be appreciated by those of ordinary skill in the art, both the read-only memory (ROM) 609 and the random access memory (RAM) 611 may store software instructions for execution by the processing unit 605.

The processing unit 605 and the system memory 607 are connected, either directly or indirectly, through a bus 613 or alternate communication structure, to one or more peripheral devices. For example, the processing unit 605 or the system memory 607 may be directly or indirectly connected to one or more additional memory storage devices, such as a "hard" magnetic disk drive 615, a removable magnetic disk drive 617, an optical disk drive 619, or a flash memory card 621. The processing unit 605 and the system memory 607 also may be directly or indirectly connected to one or more input devices 623 and one or more output devices 625. The input devices 623 may include, for example, a keyboard, a pointing device (such as a mouse, touchpad, stylus, trackball, or joystick), a scanner, a camera, and a microphone. The output devices 625 may include, for example, a monitor display, a printer and speakers. With various examples of the computer 601, one or more of the peripheral devices 615-625 may be internally housed with the computing unit 603. Alternately, one or more of the peripheral devices 615-625 may be external to the housing for the computing unit 603 and connected to the bus 613 through, for example, a Universal Serial Bus (USB) connection.

With some implementations, the computing unit 603 may be directly or indirectly connected to one or more network interfaces 627 for communicating with other devices making up a network. The network interface 627 translates data and control signals from the computing unit 603 into network messages according to one or more communication protocols, such as the transmission control protocol (TCP) and the Internet protocol (IP). Also, the interface 627 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 601 is illustrated as an example only, and it not intended to be limiting. Various embodiments of the invention may be implemented using one or more computing devices that include the components of the computer 601 illustrated in FIG. 6, which include only a subset of the components illustrated in FIG. 6, or which include an alternate combination of components, including components that are not shown in FIG. 6. For example, various embodiments of the invention may be implemented using a multi-processor computer, a plurality of single and/or multiprocessor computers arranged into a network, or some combination of both.

Some other embodiments of the invention may be implemented by software instructions, stored on a non-transitory computer-readable medium, for instructing one or more programmable computers/computer systems to perform operations such as those shown in the flow chart 400 in FIG. 4. As used herein, the term "non-transitory computer-readable medium" refers to computer-readable medium that are capable of storing data for future retrieval, and not propagating electro-magnetic waves. The non-transitory computer-readable medium may be, for example, a magnetic storage device, an optical storage device, a "punched" surface type device, or a solid state storage device.

Conclusion

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

What is claimed is:

1. A method, executed by at least one processor of a computer, comprising:
    determining weight vectors between scan chains in a circuit, value and direction of a weight vector between two scan chains representing number and direction of combinational circuit paths connecting scan cells of the two scan chains, respectively;
    generating a scan chain configuration by assigning, based on the weight vectors, some scan chains in the scan chains to a stimuli group and some other scan chains in the scan chains to a compacting group, wherein the stimuli group comprises scan chains to operate in a shifting-launching mode, the compacting group comprises scan chains to operate in a capturing-compacting-shifting mode, and total weight of weight vectors directed from the stimuli group the compacting group is maximized under at least one condition with respect to number of scan chains in the stimuli group, the compacting group, or both; and
    storing information of the scan chain configuration.

2. The method recited in claim 1, further comprising:
    removing weight vectors directed from scan chains in the stimuli group to scan chains in the compacting group from the weight vectors to form updated weight vectors;
    generating a second scan chain configuration by assigning, based on the updated weight vectors, some scan chains in the scan chains to a second stimuli group and some other scan chains in the scan chains to a second compacting group; and
    storing information of the second scan chain configuration.

3. The method recited in claim 1, wherein the generating comprises:
    selecting a weight vector that has a largest value in the weight vectors; and
    assigning a scan chain from which the weight vector is directed to the stimuli group and a scan chain to which the weight vector is directed to the compacting group.

4. The method recited in claim 3, wherein the generating further comprises:
    removing weight vectors directed to scan chains in the stimuli group and weight vectors directed from scan chains in the compacting group from consideration;
    selecting a weight vector having a next largest value;
    assigning a scan chain from which the weight vector having the next largest value is directed to the stimuli group and a scan chain to which the weight vector having the next largest value is directed to the compacting group; and
    repeating the above operations of removing, selecting and assigning until a predetermined condition is satisfied, the predetermined condition being related to number of scan chains in the stimuli group, number of scan chains in the compacting group, or both.

5. The method recited in claim 4, wherein the predetermined condition is a limit on total number of scan chains in the stimuli group and the compacting group.

6. The method recited in claim 1, wherein the capturing-compacting-shifting mode keeps scan chains from driving the integrated circuit.

7. The method recited in claim 1, wherein the capturing-compacting-shifting mode allows scan chains to drive the integrated circuit.

8. One or more non-transitory computer-readable media storing computer-executable instructions for causing one or more processors to perform a method, the method comprising:
    determining weight vectors between scan chains in a circuit, value and direction of a weight vector between two scan chains representing number and direction of combinational circuit paths connecting scan cells of the two scan chains, respectively;
    generating a scan chain configuration by assigning, based on the weight vectors, some scan chains in the scan chains to a stimuli group and some other scan chains in the scan chains to a compacting group, wherein the stimuli group comprises scan chains to operate in a shifting-launching mode, the compacting group comprises scan chains to operate in a capturing-compacting-shifting mode, and total weight of weight vectors directed from the stimuli group the compacting group is maximized under at least one condition with respect to number of scan chains in the stimuli group, the compacting group, or both; and storing information of the scan chain configuration.

9. The one or more non-transitory computer-readable media recited in claim 8, wherein the method further comprises:

removing weight vectors directed from scan chains in the stimuli group to scan chains in the compacting group from the weight vectors to form updated weight vectors;

generating a second scan chain configuration by assigning, based on the updated weight vectors, some scan chains in the scan chains to a second stimuli group and some other scan chains in the scan chains to a second compacting group; and storing information of the second scan chain configuration.

10. The one or more non-transitory computer-readable media recited in claim 8, wherein the generating comprises:

selecting a weight vector that has a largest value in the weight vectors; and assigning a scan chain from which the weight vector is directed to the stimuli group and a scan chain to which the weight vector is directed to the compacting group.

11. The one or more non-transitory computer-readable media recited in claim 10, wherein the generating further comprises:

removing weight vectors directed to scan chains in the stimuli group and weight vectors directed from scan chains in the compacting group from consideration;

selecting a weight vector having a next largest value;

assigning a scan chain from which the weight vector having the next largest value is directed to the stimuli group and a scan chain to which the weight vector having the next largest value is directed to the compacting group; and repeating the above operations of removing, selecting and assigning until a predetermined condition is satisfied, the predetermined condition being related to number of scan chains in the stimuli group, number of scan chains in the compacting group, or both.

12. The one or more non-transitory computer-readable media recited in claim 11, wherein the predetermined condition is a limit on total number of scan chains in the stimuli group and the compacting group.

13. The one or more non-transitory computer-readable media recited in claim 8, wherein the capturing-compacting-shifting mode keeps scan chains from driving the integrated circuit.

14. The one or more non-transitory computer-readable media recited in claim 8, wherein the capturing-compacting-shifting mode allows scan chains to drive the integrated circuit.

* * * * *